United States Patent [19]

Shiraishi et al.

[11] Patent Number: 5,381,374
[45] Date of Patent: Jan. 10, 1995

[54] MEMORY CELL DATA OUTPUT CIRCUIT HAVING IMPROVED ACCESS TIME

[75] Inventors: Mikio Shiraishi, Yokohama; Toshimasa Kawaai, Tokyo, both of Japan

[73] Assignee: Kabushiki Kaisha Toshiba, Kanagawa, Japan

[21] Appl. No.: 998,907

[22] Filed: Dec. 30, 1992

[30] Foreign Application Priority Data

Jan. 9, 1992 [JP] Japan .................. 4-002114

[51] Int. Cl.⁶ .................................. G11C 7/00
[52] U.S. Cl. .................... 365/203; 365/205
[58] Field of Search ........ 365/203, 204, 205, 206, 365/207, 208, 210, 185

[56] References Cited

U.S. PATENT DOCUMENTS

| | | | |
|---|---|---|---|
| 4,692,902 | 9/1987 | Tanaka et al. | 365/205 |
| 4,727,517 | 2/1988 | Ueno et al. | 365/203 |
| 4,933,906 | 6/1990 | Terada et al. | 365/204 |
| 4,982,364 | 1/1991 | Iwahashi | 365/210 |
| 5,007,023 | 4/1991 | Kim et al. | 365/203 |
| 5,138,579 | 8/1992 | Tatsumi et al. | 365/210 |

*Primary Examiner*—Eugene R. LaRoche
*Assistant Examiner*—Vu Le
*Attorney, Agent, or Firm*—Banner, Birch, McKie & Beckett

[57] ABSTRACT

A memory cell data output circuit includes a sense amplifier circuit having a first input terminal supplied with an output signal from memory cells, a second input terminal connected to dummy cells, and an output terminal, first switching element having a gate supplied with a control signal, for switching between the first input terminal and the ground potential, and second switching element having a gate supplied with an inverted signal of the control signal, for switching between the second input terminal and a power source potential, wherein the first and second switching elements respectively set the first and second input terminals to the ground potential and power source potential by turning on the switches in a preset period before the sense amplifier starts the sensing operation according to the control signals and turning off the switches after completion of the preset period.

11 Claims, 5 Drawing Sheets

MEMORY CELL DATA OUTPUT CIRCUIT HAVING IMPROVED ACCESS TIME

BACKGROUND OF THE INVENTION

1. Field of the Invention

This invention relates to a data readout circuit for memory devices, and more particularly to an electrically programmable read only memory device.

2. Description of the Related Art

A conventional readout output circuit having a sense circuit is explained below.

The readout output circuit is mainly constructed by memory cell array, a load circuit, dummy transistors, dummy cells and a sense amplifier circuit. In this case, the dummy cell is formed with the same construction as that of each of cells constituting the memory cell array.

In the operation of the readout output circuit, one of a plurality of word lines is selected according to a row address supplied from the exterior and the content of a memory cell which is connected to the selected word line is output to a bit line. Further, one of a plurality of column decoding lines is selected according to a column address signal, a column selector connected to the selected column decoding line is rendered conductive and the memory content of the memory cell output to the bit line is supplied to the first input terminal of the sense amplifier. In a case where the selected cell is an OFF cell which is always set in the nonconductive state, the potential of the first input terminal ($Vin_{(OFF)}$) is determined by the load circuit. On the other hand, in a case where the selected cell is an ON cell which can be in the conductive state when the word line voltage rises over the threshold voltage of that cell, the voltage of the first input terminal ($Vin_{(ON)}$) is determined by the cell current conducted by the ON cell. The voltage of the second input terminal of the sense amplifier (Vref) is set to the center between the two voltage $Vin_{(OFF)}$ and $Vin_{(ON)}$ by the dummy cell and another load circuit for the dummy cell. The sense amplifier is used to amplify a potential difference between the first input terminal and the second input terminal, and it outputs the memory content of the selected memory cell.

In the data readout circuit for the above memory cell array, it is required to enhance the data readout speed to meet the recent technical requirements and the following methods may be considered as a method for satisfying the above requirements. That is, the methods include a method for enhancing the sensitivity of the sense amplifier and a method for enhancing the discharging speed of charges stored on the bit line by increasing a permissible current (cell current) in the memory cell.

However, when the cell current is increased, the power consumption of the memory cell is increased and the pattern area of the memory cells is increased so that the chip size of the memory will be increased. Thus, the method of enhancing the operation speed of the readout output circuit by increasing the cell current in the memory cell has a limitation and it is required to propose a method for effectively enhancing the operation speed.

SUMMARY OF THE INVENTION

An object of this invention is to provide a data readout output circuit in which the operation speed of reading out data stored in a memory cell is enhanced.

The above object can be attained by a memory cell data output circuit which comprises a sense amplifier circuit having a first input terminal supplied with an output signal from memory cells, a second input terminal connected to dummy transistor, and an output terminal; a dummy cell connected to dummy transistor first switching means having a gate supplied with a control signal, for switching between the first input terminal and the ground potential; and second switching means having a gate supplied with an inverted signal of the control signal, for switching between the second input terminal and a power source potential; wherein the first and second switching means respectively set the first and second input terminals to the ground potential and power source potential by turning on the switches in a preset period before the sense amplifier starts the sensing operation according to the control signals and turning off the switches after completion of the preset period.

In this invention, with the above construction, the precharge operation can be effected by use of the first and second switching means attached to the sense amplifier of the data readout circuit before the sensing operation of the sense amplifier. As a result, the signal supplied from the memory cell array to the first input terminal of the sense amplifier is forcedly set at the ground potential for a preset period of time and the second input terminal connected to the dummy cell is forcedly set at the power source potential in a preset period of time.

Since an output voltage of the sense amplifier obtained at the time of completion of the precharging operation can be set equal to an output voltage obtained when "0" data corresponding to content of an ON cell is read out by effecting the precharging operation of the sense amplifier, time (access time Tacc0) necessary for reading out "0" data can be extremely reduced. On the other hand, in a case where "1" data corresponding to content of an OFF cell is read out, an input signal Vin is abruptly raised from the ground potential to a voltage determined by the load circuit and a reference potential Vref is abruptly lowered from the power source potential to its steady-state value by the precharging operation when the sense amplifier starts the sensing operation. As a result, a potential difference between two signals detected by the sense amplifier more rapidly varies in comparison with that in the conventional circuit. Therefore, the sense amplifier can output the result of detection of the potential difference earlier than in the conventional case, and as a result, an output circuit whose sensing operation speed is enhanced can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described a readout output circuit using a sense circuit according to an embodiment of this invention with reference to the accompanying drawings.

Figure 1:
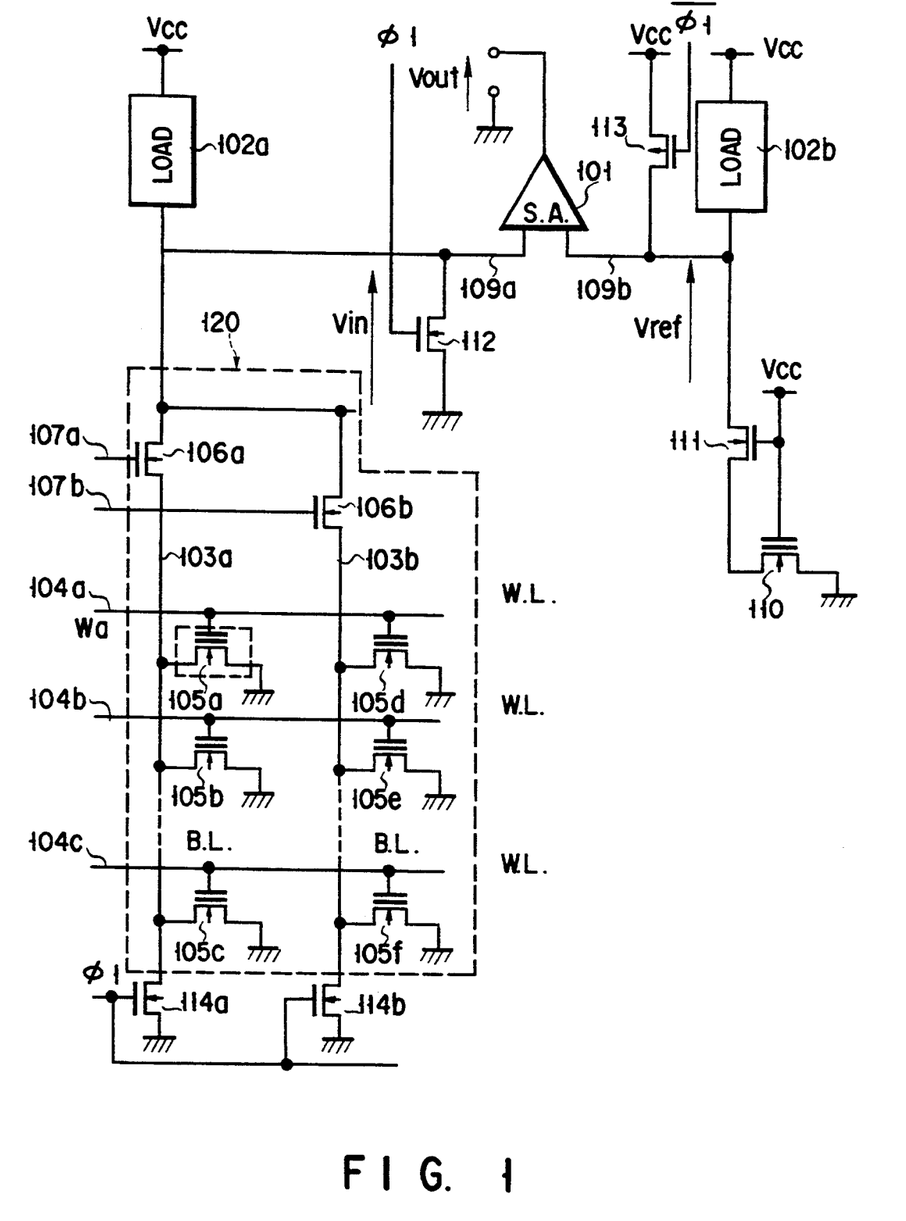
FIG. 1 is a circuit diagram showing a readout output circuit using a sense amplifier according to one embodiment of this invention.

FIG. 1 is a circuit diagram showing a readout output circuit according to one embodiment of this invention.

First, the construction of the readout output circuit shown in FIG. 1 is explained.

The readout output circuit includes a sense amplifier 101, a memory cell array 120, a load circuit 102a connected to the memory cell array 120, a dummy transistor 111, a dummy cell 110, a load circuit 102b connected to the dummy transistor 111, an input side switch 112, a reference side switch 113 and bit line switches 114a and 114b.

The dummy cell 110 has the same construction as that of each of the cells constituting the memory cell array 120.

The input side switch 112, reference side switch 113, and bit line switches 114a and 114b are each formed of a MOSFET.

The first input terminal of the sense amplifier 101 is connected to one end of the load circuit 102a, one end of the current path of the input side switch 112 and one end of each of the current paths of column selectors 106a and 106b via an input line 109a.

Further the second input terminal of the sense amplifier 101 is connected to one end of the load circuit 102b, one end of the current path of the reference side switch 113 and one end of the current path of the dummy transistor 111 via an input line 109b.

The output terminal of the sense amplifier 101 is connected to an output buffer (not shown) or the like. The other ends of the load circuits 102a and 102b are supplied with a power source voltage Vcc.

The other end of the current path of the dummy transistor 111 is connected to one end of the current path of the dummy cell 110, the other end of the current path of the dummy cell 110 is grounded, and a power source voltage Vcc is applied to the gate electrode of the dummy transistor 111 and the control electrode of the dummy cell 110.

A power source voltage Vcc is applied to one end of the current path of the reference side switch 113 and the control electrode thereof is supplied with a clock signal $\overline{\phi 1}$—(which is defined as an inverted form of the clock signal $\phi 1$). The other end of the current path of the input side switch 112 is grounded and the control electrode thereof is supplied with the clock signal $\phi 1$.

The memory cell array 120 includes column selectors 106a and 106b which are respectively connected to column decoding lines 107a and 107b and memory cells 105a to 105f which are respectively connected to word lines 104a to 104c and bit lines 103a, 103b.

One end of the current path of the column selector 106a is connected to the input line 109a, the other end of the current path is connected to the bit line 103a, and the gate electrode thereof is connected to the column decoding line 107a.

One end of the current path of the column selector 106b is connected to the input line 109a, the other end of the current path is connected to the bit line 103b, and the gate electrode thereof is connected to the column decoding line 107b.

The memory cells 105a to 105f are arranged at intersections between the bit lines and the word lines, one end of each of the current paths of the memory cells is connected to a corresponding one of the bit lines 103a and 103b, the other ends of the current paths are grounded, and each of the control electrodes thereof is connected to a corresponding one of the word lines 104a, 104b and 104c.

One-side ends of the current paths of the bit line switches 114a and 114b are respectively connected to the bit lines 103a and 103b, the other ends of the current paths are grounded and the control electrodes thereof are supplied with the clock signal $\phi 1$.

Next, the operation of the readout output circuit shown in FIG. 1 for reading out the memory content of the memory cell 105a is explained with reference to FIGS. 2, 3, 4 and 5.

Figure 2:
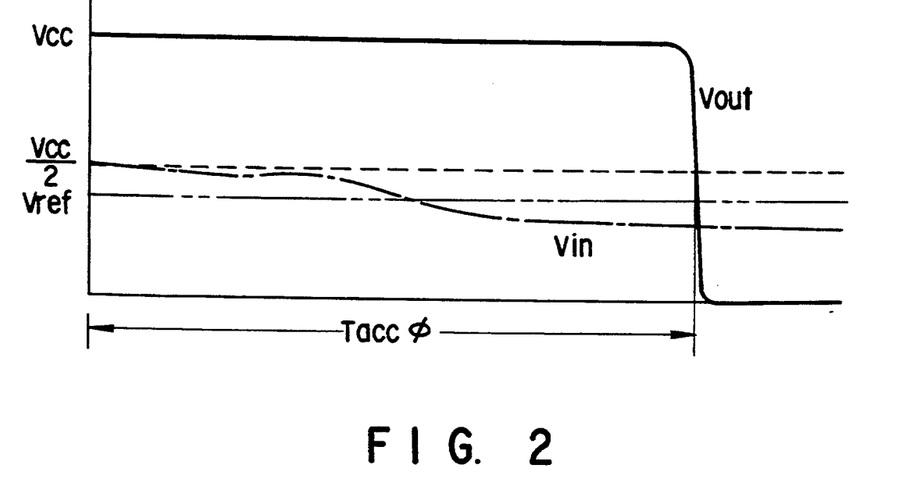
FIG. 2 is a timing chart for illustrating the readout operation of a conventional readout output circuit for reading out data "0"
Figure 3:
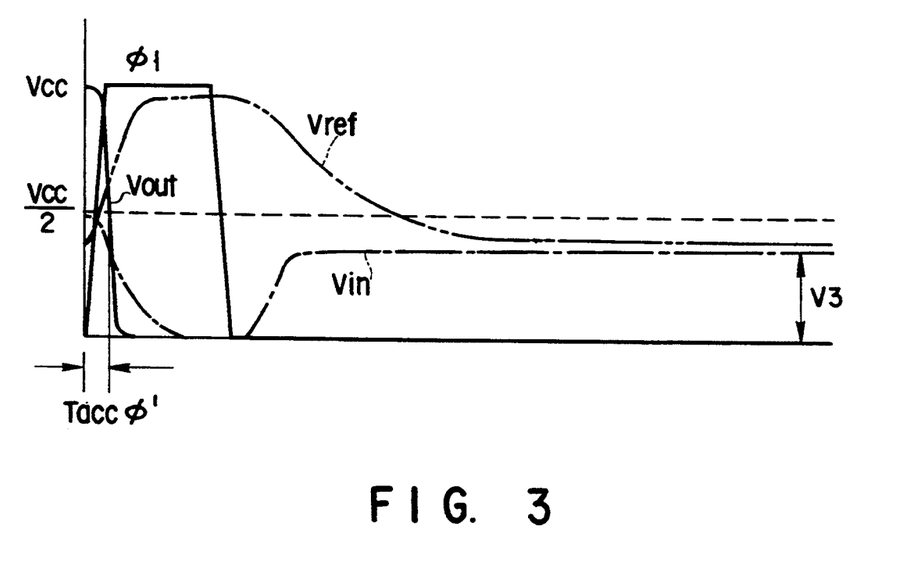
FIG. 3 is a timing chart for illustrating the readout operation of the readout output circuit of FIG. 1 for reading out data "0"

FIG. 2 is a timing chart for illustrating the readout operation of a conventional readout output circuit for reading out data "0" and FIG. 3 is a timing chart for illustrating the readout operation of the readout output circuit of FIG. 1 for reading out data "0". The above timing charts each illustrate the readout operation effected in a case where the memory cell 105a is formed of an on cell (in which electrons are not injected into the floating gate). In FIGS. 2 and 3, the reference voltage Vref, input voltage Vin and an output voltage Vout of the sense amplifier are shown together with the clock signal $\phi 1$.

Now, the operations of the conventional circuit and the readout output circuit of this invention effected in a case where the memory cell 105a is constructed by an on cell is explained with reference to FIGS. 2 and 3.

As is clearly seen from FIG. 2, a signal Vin supplied from the memory cell and input to the first input terminal 109a is gradually lowered with time from a preset potential determined by load circuit 102a according to cell current of a selected memory cell. After this, when Vin becomes lower than the reference potential Vref of the sense amplifier, the sense amplifier is operated, and the output voltage Vout rises beyond Vcc/2, it is determined that the sensing operation is completed and the access time Tacc0 is determined.

In FIG. 3, the operation of the output circuit of this invention is illustrated. That is, the difference between this invention and the conventional case is that the switching circuit which is operated by the clock signals φ1 and $\overline{\phi 1}$ is provided and the precharging operation of the sense amplifier is effected by use of the switching circuit.

The readout operation effected in a case where the memory cell 105a is constructed by an ON cell is explained with reference to FIG. 3.

As shown in FIG. 3, an address signal is supplied to the memory cell array 120 and the clock signal φ1 is set to a high level before effecting the readout operation.

When the clock signal φ1 is set to the high level, a high level signal is supplied to the control electrodes of the input side switch 112 and the bit line switches 114a and 114b and a low level signal is supplied to the control electrode of the reference side switch 113 so that all of the input side switch 112, reference side switch 113, and bit line switches 114a and 114b will be turned on.

The column selector 106a is rendered conductive in a period T1 in which the clock signal φ1 is kept at the high level and the row address decoding signal Wa is changed from the low level to the high level, but since the switches 112, 113, 114a and 114b are set in the ON state, the input voltage vin is set at 0, the reference voltage Vref is set at Vcc, the output voltage Vout is set at 0, and the sensing operation is not effected.

After this, when time T1 has elapsed and the clock signal φ1 is set to the low level, a high level signal is supplied to the control electrode of the reference side switch 113 and a low level signal is supplied to the control electrodes of the input side switch 112 and the bit line switches 114a and 114b so that all of the input side switch 112, reference side switch 113, and bit line switches 114a and 114b will be turned off. As a result, the reference voltage Vref is changed to a constant voltage V3 which is determined by the load circuit 102b, dummy cell 110 and dummy transistor 111.

Since the memory cell 105a is an ON cell, the drain-source path thereof is made conductive so as to permit a cell current to flow therethrough when the row address signal Wa supplied to the word line 104a exceeds the threshold voltage thereof, and then the input voltage Vin may rise only to a voltage $Vin_{(ON)}$ which is lower than the reference voltage Vref.

That is, since a selected cell is an on cell, an output Vout of the sense amplifier is kept unchanged after the precharging operation and the sensing operation is completed simply by effecting the precharging operation. As a result, the access time can be reduced.

For example, while the conventional access time Tacc0 is 120 ns, the access time of the sense amplifier for "0" data in the output circuit of FIG. 3 is completed after Tacc0' of 5 ns has elapsed. Further, the precharging time of 25 ns is used as an example of the precharging time φ1 defined by the clock signal φ1.

Next, a case wherein the memory cell 105a is constructed by an OFF cell is explained with reference to FIGS. 4 and 5.

Figure 4:
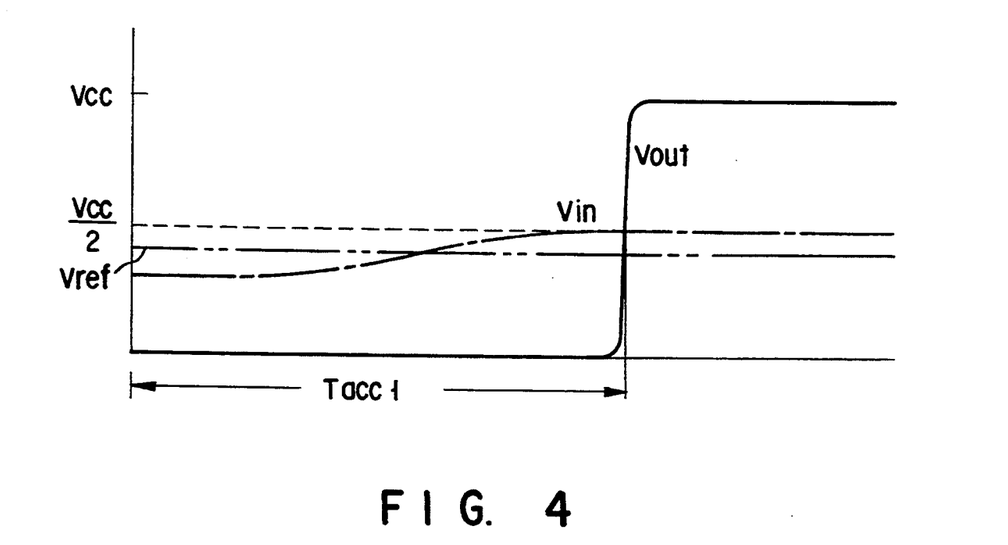
FIG. 4 is a timing chart for illustrating the readout operation of a conventional readout output circuit for reading out data "1"
Figure 5:
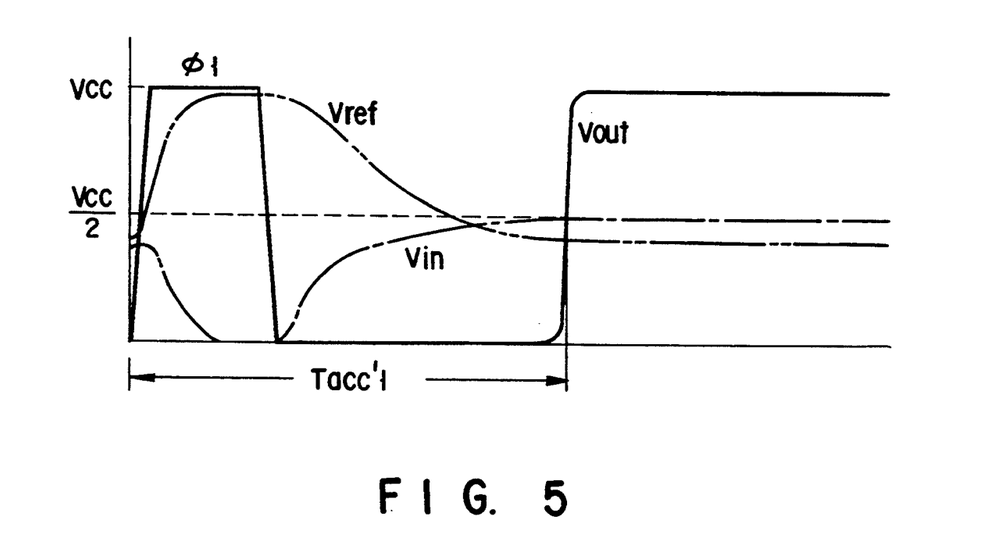
FIG. 5 is a timing chart for illustrating the readout operation of the readout output circuit of FIG. 1 for reading out data "1"

FIG. 4 is a timing chart for illustrating the readout operation of a conventional readout output circuit for reading out data "1" and FIG. 5 is a timing chart for illustrating the readout operation of the readout output circuit of FIG. 1 for reading out data "1". The above timing charts each illustrate the readout operation effected in a case where the memory cell 105a is formed of an OFF cell (in which electrons are injected into the floating gate).

In FIG. 4, when an input voltage Vin gradually rises to a potential level higher than the reference voltage Vref, the sense amplifier starts the operation and an output voltage Vout thereof changes from the ground potential, exceeds Vcc/2 and then reaches the power source voltage Vcc. Thus, the conventional access time Tacc1 is determined.

On the other hand, in the data readout output circuit of this invention having the access time Tacc1' as shown in FIG. 5, the precharging operation of the sense amplifier is effected so that the input signal Vin will be rapidly raised from the ground potential to a potential determined by the load circuit and the reference potential Vref will be lowered from the power source potential Vcc to its steady-state potential when the sense amplifier starts the sensing operation. Therefore, a potential difference between the two signals detected by the sense amplifier will be more rapidly changed in comparison with the conventional case. As a result, the sense amplifier may output the result of detection of the potential difference earlier than in the conventional case, and consequently, an output circuit having optimum access time Tacc1' can be obtained.

In addition, since a substantial influence at the "0" data readout time can be eliminated by the precharging operation of the sense amplifier of this invention, it is not necessary to set the reference voltage to the center voltage $[Vin_{(ON)}+Vin_{(OFF)}]/2$ between an input voltage $Vin_{(ON)}$ corresponding to the on cell and an input voltage $Vin_{(OFF)}$ corresponding to the off cell unlike the conventional case and it becomes possible to set the reference voltage which is closer to $Vin_{(ON)}$. In this invention, since Vin always rises from the ground potential after the precharging operation, the access time set at the "1" data readout time can be reduced by setting the final value (a voltage set in the steady state) of the reference voltage vref closer to $Vin_{(ON)}$.

For example, while the access time Tacc1 in FIG. 4 is 106 ns, the access time Tacc1' in FIG. 5 is 90 ns. From the above data and the data obtained at the time of "0" data readout, it is understood that the conventional access time Tacc=120 ns and the access time Tacc of this invention=90 ns based on the equation Tacc=max{Tacc0, Tacc1} and thus the access time can be reduced by the precharging operation of the sense amplifier in this invention.

Next, the operation illustrated in FIG. 5 is explained.

First, when the clock signal φ1 is raised to the high level, the input side switch 112, reference side switch 113, and bit line switches 114a and 114b are all turned on as described before and the reference voltage Vref is set to the power source voltage Vcc, the input voltage Vin is set to the ground potential and the output Vout is set to the ground potential.

Next, when the clock signal φ1 is set to the low level, the input side switch 112, reference side switch 113, and bit line switches 114a and 114b are all turned off. Since, at this time, the memory cell 105a is an OFF cell, the memory cell 105a is kept in the OFF state irrespective of the potential of the word line 104a. Therefore, as shown in FIG. 5, the input voltage Vin exceeds the reference voltage Vref which is lowered after the precharging operation and rises to a voltage Vin (OFF) which is determined by the load circuit 102a.

When the input voltage vin exceeds the reference voltage Vref, the sense amplifier 101 starts the operation, the output voltage Vout thereof is changed from the low level to the high level (from 0 to Vcc) as shown in FIG. 5, and thus the sensing operation is effected.

Thus, the operation of the readout output circuit shown in FIG. 1 is determined by the capacitances of the bit lines 103a and 103b and the internal impedance of the load circuit 102a and is not influenced by the cell current flowing in the memory cell.

Further, a cell current flowing in the reference voltage generating dummy cell 110 gives an influence to the time required for the reference voltage Vref to change from the power source voltage Vcc to a constant voltage, but the capacitance of a circuit connected to the dummy cell 110 can be set to be sufficiently smaller than the capacitance of the bit line. Therefore, an influence of the cell current on the operation speed of the readout output circuit is extremely small.

Next, a second embodiment of this invention is explained.

Figure 6:
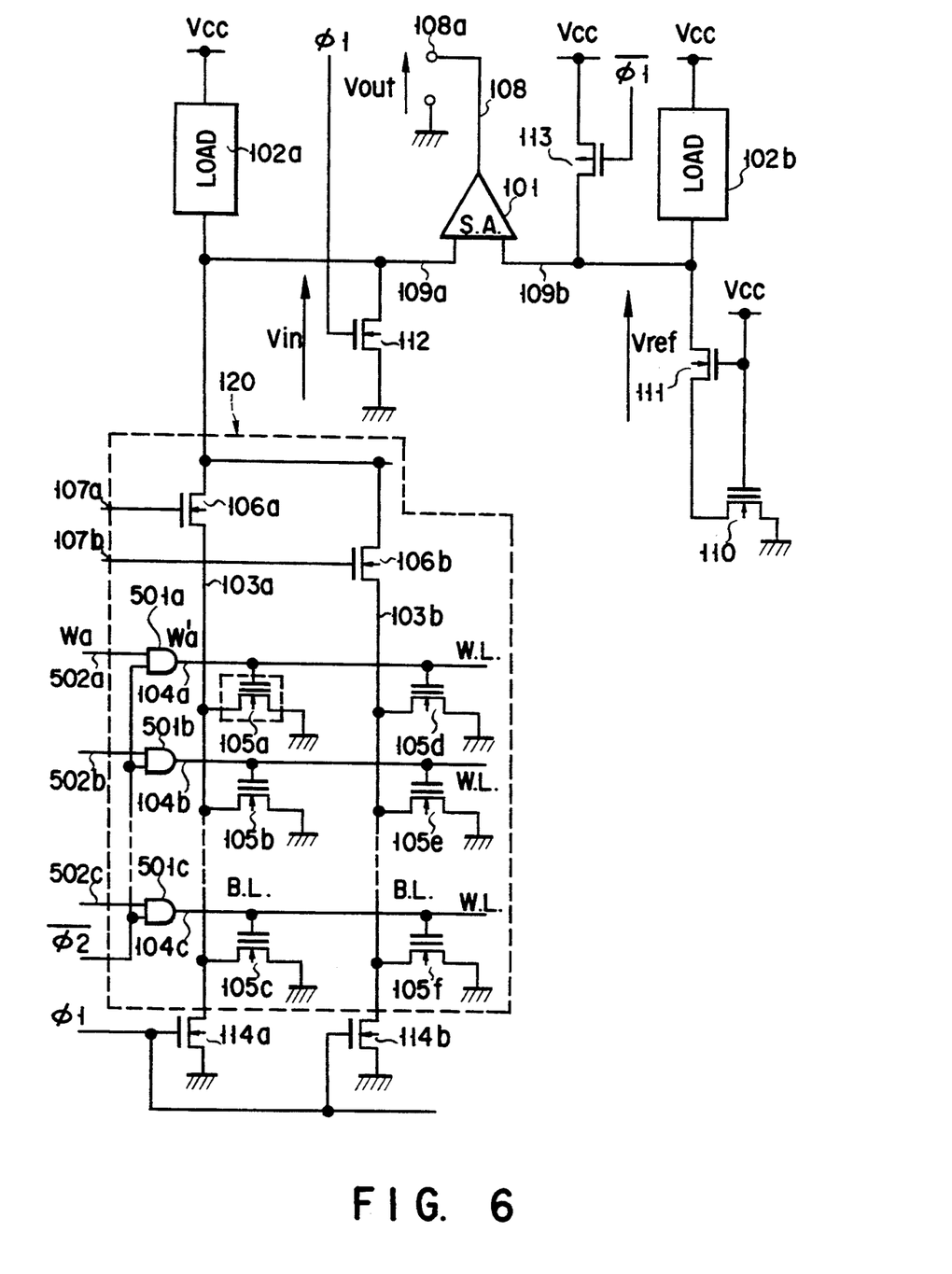
FIG. 6 is a circuit diagram showing a readout output circuit according to another embodiment of this invention.

A readout output circuit shown in FIG. 6 is a modification of the readout output circuit shown in FIG. 1 and is obtained by adding AND circuits 501a, 501b and 501c to the readout output circuit of FIG. 1.

The output terminals of the AND circuits 501a, 501b and 501c are respectively connected to word lines 104a, 104b and 104c, the first input terminals thereof are respectively connected row address decoding lines 502a, 502b and 502c, and the second input terminals thereof are supplied with a clock signal $\phi 2$—(which is a delaying clock signal for delaying the row address decoding signal Wa).

Since the construction of the remaining circuit section of the readout output circuit of FIG. 6 is the same as that of a corresponding circuit section of the readout output circuit of FIG. 1, portions of FIG. 6 which are the same as those of FIG. 1 are denoted by the same reference numerals and the explanation therefor is omitted.

Next, the operation of reading out the memory content of the memory cell 105a is explained with reference to FIGS. 7 and 8.

Figure 7:
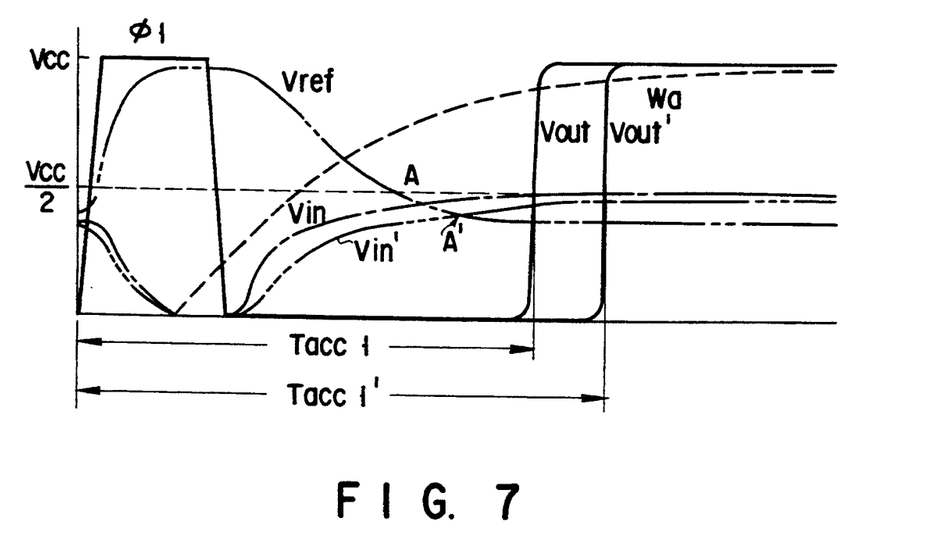
FIG. 7 is a timing chart indicating a reduction in the operation speed due to deterioration with time and an insufficient amount of written charges.
Figure 8:
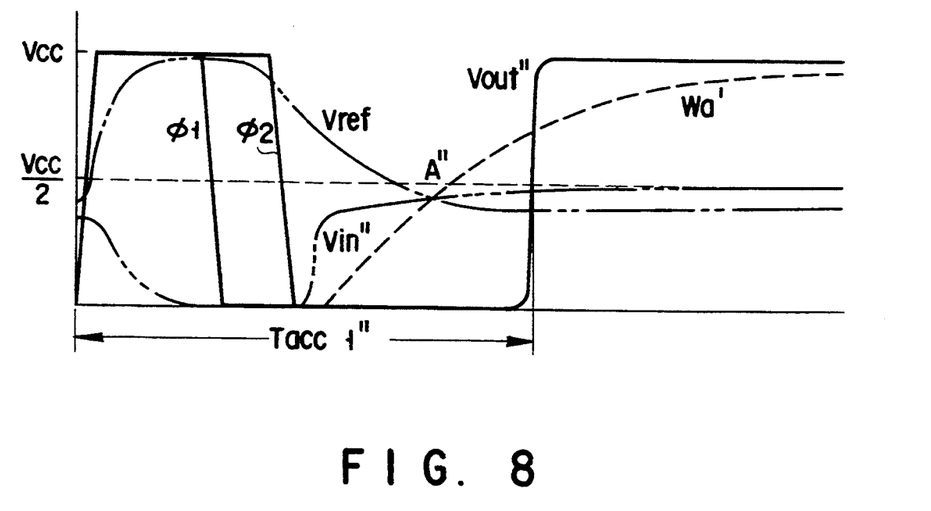
FIG. 8 is a timing chart indicating the improvement attained by the delay circuit of FIG. 6.

FIG. 7 is a timing chart indicating a reduction in the operation speed due to deterioration with time and an insufficient amount of written charges and FIG. 8 is a timing chart indicating the improvement attained by the delay circuit of FIG. 6.

In FIG. 7, an input potential Vin' obtained when an OFF cell is accessed due to the deterioration with time becomes dull in a case where each of the memory cells in the memory cell array is formed of a floating gate FET is shown together with the input potential Vin which is the same as that shown in the timing chart of FIG. 5 for illustrating the "1" data readout operation. With such an incomplete cell, the turn-off characteristic thereof obtained when the potential of the control gate electrode, that is, the potential of the word line 104a is set at the high level is not sufficient and a leakage current will slightly increase. The leakage current lowers the speed of the operation of the load for charging the bit line at the time of sensing operation. That is, in FIG. 7, the input voltage Vin' obtained when the bit line charging is slowed delays the sensing operation of the sense amplifier to output an output signal at the timing of Vout', thereby causing access time Tacc1' to contain the delay time.

The AND circuits 501a, 501b and 501c shown in FIG. 6 are used to solve the problem of access time delay in a manner as shown in the timing chart of FIG. 8 and delay the activating timing of the word line WL to the timing of the clock signal $\phi 2$. This improvement is indicated by a new timing signal Wa' for the word line in FIG. 8, and even if the timing signal Wa for the word line is made active, charges are stored on the bit line via the load circuit 102a at the same speed as that determined when a cell free from deterioration with time is accessed and for a preset period of time in which the AND circuits are disabled by the clock signal $\phi 2$. As a result, the input potential Vin' which is made dull by the deterioration with time is changed to a new input potential Vin" having a locus which can be obtained by recovering the charging speed by the amount of stored charges. Thus, since new access time Tacc1" obtained based on the input potential Vin" is set to a value which is close to the first access time Tacc1, delay of the access time can be previously prevented by the improvement attained by use of the AND circuits 501a, 501b and 501c of FIG. 6 and the clock signal $\phi 2$ even when the charge leakage due to the deterioration with time occurs in the floating gate FETs 105a to 105f of the memory cell array 120.

This invention is not limited to the above embodiments and can be variously modified. For example, in the embodiment shown in FIG. 1, the input side switch 112, reference side switch 113, and bit line switches 114a and 114b are each formed of a MOSFET, but may be formed of another switching circuit.

With the above construction, since the operation speed of reading out data from the memory cell is not dependent on the cell current, the operation speed of reading out data from the memory cell can be enhanced without increasing a current flowing in the memory cell.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A memory cell data output circuit for use with a memory cell comprising:
    a dummy cell:
    a sense amplifier circuit for sensing and amplifying data stored in said memory cell, said sense amplifier circuit having a first input terminal supplied with an output signal from said memory cell, a second input terminal connected to said dummy cell, and an output terminal;
    first switching means, having a control input electrode supplied with a first control signal, for switching between said first input terminal and a ground potential; and
    second switching means, having a control input electrode supplied with a second control signal for switching between said second input terminal and a power source potential, the second control signal being inverted with respect to the first control signal;
    wherein said first and second switching means respectively set said first and second input terminals to the ground potential and power source potential by turning on said first and said second switching means in a preset period before said sense amplifier starts sensing information according to the first and second control signals and turning off said first and said second switching means after completion of the preset period.

2. A memory cell data output circuit according to claim 1, further comprising load circuits respectively connected to the first and second input terminals of the sense amplifier.

3. A data memory apparatus comprising:
a dummy cell:
a memory cell array having a plurality of memory cells;
sense amplifier means having a first input terminal supplied with an output signal from said memory cells, a second input terminal connected to said dummy cell, and an output terminal, for sensing information stored in said memory cell array;
first switching means having a control input electrode supplied with a first control signal, for switching between said first input terminal and a ground potential;
second switching means having a control input electrode supplied with a second control signal being inverted with respect to the first control signal, for switching between said second input terminal and a power source potential, said first and second switching means respectively setting said first and second input terminals to the ground potential and power source potential by turning on said switching means in a preset period before said sense amplifier starts sensing information according to the first and second control signals and turning off said switching means after completion of the preset period; and
load circuits respectively connected to said first and second input terminals of said sense amplifier.

4. A memory cell data output circuit according to claim 3, further comprising
means for delaying a word line selecting signal by a predetermined time the word line selecting signal for selecting a memory cell in said memory cell array.

5. A memory cell data output circuit according to claim 1, wherein the switching means are constructed by MOS FETs.

6. A data memorizing apparatus according to claim 3, wherein the memory cells are constructed by MOS FETs having a floating gate.

7. A memory cell data output circuit according to claim 4, wherein said delay means includes a plurality of AND circuits each having a first input terminal supplied with one word line selecting signal of said memory cell array, a second input terminal supplied with a third control signal which is set into an active state at a delay time and an output terminal for supplying an output to said memory cells of said memory cell array.

8. A semiconductor memory device comprising:
a memory cell;
a dummy cell;
a sense amplifier for sensing a potential difference between a first input terminal and a second input terminal;
a first switch of a first conductivity type, responsive to a first control signal, for switching between supplying said first input terminal with an output signal from said memory cell or with a ground potential;
a second switch of a second conductivity type, responsive to a second control signal, for switching between supplying said second input terminal with an output signal from said dummy cell or with a power source potential, the second control signal being inverted with respect to the first control signal.

9. The memory cell data output circuit of claim 8 wherein said first switch sets said first input terminal to the ground potential and said second switch sets said second input terminal to the power source potential before said sense amplifier begins sensing the potential difference.

10. The memory cell data output circuit of claim 9, further including a delay circuit for delaying a word line selecting signal by a predetermined time, the word line selecting signal for selecting said memory cell to generate the output signal.

11. A data output circuit for outputting data from a memory cell, comprising:
a reference potential;
a sense amplifier having a first input connected to said reference potential and a second input connected to said memory cell, said sense amplifier operating to sense and amplify a potential difference between said first input and said second input;
a first switch for selectively connecting said first input to a first potential;
a second switch for selectively connecting said second input to a second potential different from said first potential; and
means for applying control signals to said first switch and said second switch to bring said first input and said second input to said first potential and said second potential, respectively, for a time period prior to a time said sense amplifier operates.

* * * * *